(12) United States Patent
Brunson et al.

(10) Patent No.: US 7,394,245 B2
(45) Date of Patent: Jul. 1, 2008

(54) RESONANT MAGNETOMETER DEVICE

(75) Inventors: Kevin M Brunson, Malvern (GB); David O King, Malvern (GB)

(73) Assignee: Qinetiq Limited, London (GB)

( * ) Notice: Subject to any disclaimer, the term of this patent is extended or adjusted under 35 U.S.C. 154(b) by 45 days.

(21) Appl. No.: 10/572,379

(22) PCT Filed: Sep. 21, 2004

(86) PCT No.: PCT/GB2004/004017

§ 371 (c)(1),
(2), (4) Date: Mar. 16, 2006

(87) PCT Pub. No.: WO2005/029107

PCT Pub. Date: Mar. 31, 2005

(65) Prior Publication Data

US 2007/0030001 A1 Feb. 8, 2007

(30) Foreign Application Priority Data

| Sep. 23, 2003 | (GB) | ................................. | 0322236.1 |
| Oct. 3, 2003 | (GB) | ................................. | 0323157.8 |

(51) Int. Cl.
*G01R 33/02* (2006.01)

(52) U.S. Cl. ..................................................... 324/244

(58) Field of Classification Search ................. 324/244, 324/252, 259, 260, 207.14, 658, 660, 661, 324/686, 690; 331/65
See application file for complete search history.

(56) References Cited

U.S. PATENT DOCUMENTS

| 5,920,012 | A | * | 7/1999 | Pinson | ..................... 73/504.12 |
| 5,953,683 | A | * | 9/1999 | Hansen et al. | ................. 702/95 |
| 5,959,452 | A | | 9/1999 | Givens et al. | |
| 5,998,995 | A | | 12/1999 | Osiander et al. | |
| 6,275,034 | B1 | | 8/2001 | Tran et al. | |
| 6,429,652 | B1 | | 8/2002 | Allen et al. | |
| 6,486,665 | B1 | * | 11/2002 | Funk et al. | ................... 324/260 |
| 6,504,356 | B2 | | 1/2003 | Yao et al. | |
| 7,064,541 | B2 | * | 6/2006 | Richards et al. | ............. 324/244 |

FOREIGN PATENT DOCUMENTS

| EP | 0 389 390 | 9/1990 |
| EP | 0 392 945 | 10/1990 |

OTHER PUBLICATIONS

Kadar, Zsolt, Integrated Resonant Magnetic Field Sensor, Thesis, 1997, Chapts. 1-4.*
International Search Report for PCT/GB2004/0004017 dated Jan. 18, 2005.
UK Search Report for GB 0322236.1 dated Feb. 9, 2004.
UK Search Report for GB 0323157.8 dated Feb. 9, 2004.

* cited by examiner

*Primary Examiner*—Reena Aurora
*Assistant Examiner*—Kenneth J. Whittington
(74) *Attorney, Agent, or Firm*—Nixon & Vanderhye P.C.

(57) ABSTRACT

A resonant magnetometer comprises a substrate having a member and circuitry for passing an alternating current (AC) through the member. The magnetometer is characterized in that a driver is also provided to impart a magnetic field independent oscillatory force to the member. Disclosed is a micro-electro mechanical systems (MEMS) implementation of a magnetometer.

29 Claims, 7 Drawing Sheets

RESONANT MAGNETOMETER DEVICE

Figure 1:
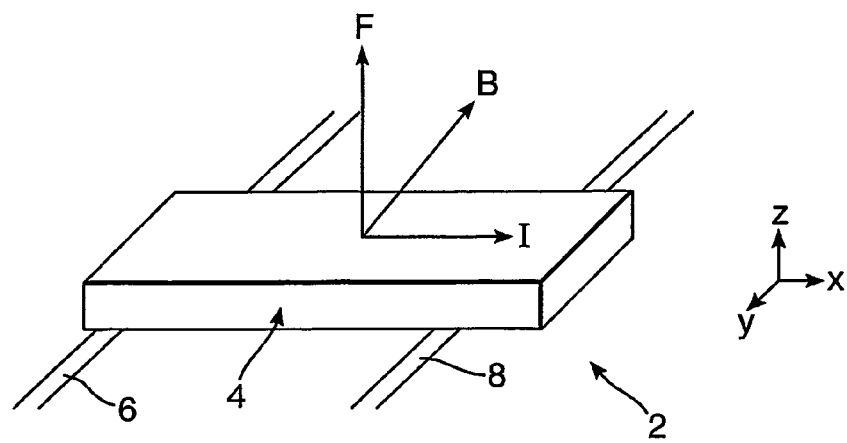

This application is the U.S. national phase of international application PCT/GB2004/004017 filed 21 Sep. 2004 which designated the U.S. and claims benefit of GB 0322236.1 filed 23 Sep. 2003, and GB 0323157.8 filed 3 Oct. 2003, and the entire contents of each of which are hereby incorporated by reference.

BACKGROUND OF THE INVENTION

1. Field of the Invention

This invention relates to a magnetometer and in particular to a Micro-electro mechanical systems (MEMS) self-resonant magnetometer.

2. Discussion of Prior Art

Resonant magnetometers are well known. One of the earliest MEMS based resonant magnetometers is described by D. K. Wickenden et al in the paper "MEMS based resonating Xylophone Bar Magnetometers", SPIE Conference Proceedings—Micromachined Devices and Components IV, SPIE Vol. 3514, pp 350-358, 1998. The Wickenden et al device comprises a surface micro-machined bar that is fixed to a pair of electrodes at the nodes of its first resonant mode. In use, an alternating current (AC) is passed through the bar at the resonant frequency of the bar. In the presence of a magnetic field, the Lorenz force causes the bar to resonate and the magnitude of any such movement is sensed capacitively to provide an indication of the strength of the applied magnetic field.

A variation to the basic MEMS resonant magnetometer design has recently been described by Zaki Izham, Michael C L Ward, Kevin M Brunson and Paul C Stevens in the paper entitled "Development of a Resonant Magnetometer"; see Proceedings of the 2003 Nanotechnology Conference and Trade show, February 23-27, San Francisco; Volume 1, pp 340-343, ISBN 0-9728422-0-9. The Izham et al resonant magnetometer is formed from a silicon-on-insulator (SOI) wafer and comprises a oscillatory mass having two sets of fixed-fixed suspensions that allow it to move along an axis in the plane of the wafer. An AC current having a frequency around the resonant frequency of the oscillatory mass is passed along the suspension thereby causing the mass to resonate in the presence of a magnetic field. A set of electrodes are attached to the mass to allow the magnitude of any magnetic field induced movement to be measured capacitively.

To maximise Q amplification in a resonant magnetometer, it is necessary to ensure that the frequency of the AC current supplied to the oscillatory mass matches, or is sufficiently close to, the resonant frequency thereof. Although the resonant frequency of a beam can be predicted theoretically and/or measured, variations may arise from temperature variations, stress induced effects and/or any non-inearities that are present in the resonant beam suspension. If an AC current is applied that has a frequency away from the resonant condition, the sensitivity of the device will be greatly diminished due to the loss of the Q amplification of the Lorentz force.

To ensure the resonant beam is driven into resonance, it is known to adjust the output frequency of the frequency generator in response to the output of a pick-up circuit that is used to sense the oscillation frequency of the beam. A phase-lock loop is then used to ensure that the frequency of the applied AC tracks any change in the oscillation frequency of the resonant beam. However, phase-lock loop circuits can introduce unwelcome phase noise because they must constantly search for the optimum frequency.

In high sensitivity applications, such as compasses and the like, the resonant magnetometer requires a mechanical Quality factor (Q) of between about 500 to 5000 and a resonant frequency within the range of around 500 Hz to 30 kHz. This high Q factor means that the frequency generator used to supply the AC current to the resonant beam structure needs to have an accuracy better than 1 Hz in several kHz. The provision of such a high resolution frequency generator, in addition to the provision of phase lock loop circuitry, adds cost and complexity to the control electronics that are required to operate the device.

SUMMARY OF THE INVENTION

It is an object of the present invention to provide a resonant magnetometer device in which at least some of the above mentioned disadvantages are mitigated.

According to a first aspect of the invention, a resonant magnetometer comprises an oscillatory member and means for passing an alternating current (AC) through said oscillatory member, characterized in that driving means are additionally provided to impart a magnetic field independent oscillatory force to the oscillatory member.

The oscillatory force applied (e.g. electrostatically) to the oscillatory member by the driving means is independent of magnetic field strength and preferably has a magnitude that is sufficient to ensure that, during use, the oscillatory member is continually forced into resonance. A Lorentz oscillatory force will also arise on application of a magnetic field due to the interaction of said magnetic field with the AC current passing through the oscillatory member. As described above, the magnitude of the Lorentz oscillatory force is, for a given amplitude of AC, dependent on the strength of magnetic field applied to the oscillatory member. In the absence of a magnetic field, no Lorentz oscillatory force will be imparted to the oscillatory member (i.e. the Lorentz oscillatory force will have zero amplitude).

A resonant magnetometer is thus provided in which an oscillatory member is driven into resonance by the combination of a magnetic field dependent (i.e. Lorentz) oscillatory force and a magnetic field independent oscillatory force that is applied by a driving means. The present invention thus provides a magnetometer which, unlike prior art devices, has an oscillatory member that is driven into resonance even in the absence of an applied magnetic field. On application of a magnetic field, the amplitude of oscillation of the oscillatory member will alter in a detectable manner.

Ensuring the oscillatory member is continually driven to resonance by providing the driving means provides several advantages over prior art devices that are only driven to resonance on the application of a magnetic field. Firstly, continuous measurement of the resonant frequency of the oscillatory member is possible. This is advantageous where the magnetometer is to be used in a variety of different environments that produce a marked change in resonant properties (e.g. at different temperatures, pressures etc). Previously, such measurements of resonant frequency were only possible when a sufficiently strong magnetic field was applied. Secondly, the magnetometer typically has a lower magnetic field strength detection threshold than prior art devices in which the applied magnetic field has to be sufficient to initiate resonance.

It should be noted that the Lorentz force produced by the interaction of the AC with the magnetic field and the oscillatory force provided by the driving means are preferably arranged to be in-phase or out-of-phase. In such cases, the amplitude of oscillation of the oscillatory member will increase or decrease, depending on magnetic field direction, in the presence of an applied magnetic field. It would be recognised that the magnetic field direction can be readily determined from whether the amplitude of oscillation increases or decreases.

Advantageously, the magnetometer comprises sensing means for providing an electrical output signal dependent on the deflection of the oscillatory member.

Conveniently, the driving means comprises a positive feedback circuit for receiving the electrical signal produced by the sensing means. The driving means is thus arranged to drive the oscillatory member into resonance using a positive feedback loop. In other words, the signal produced by the sensing means is appropriately processed (e.g. amplified and/or phase shifted as required) by the positive feedback circuit and used by the driving means to produce (e.g. electrostatically) an oscillatory force. This ensures that the driving means continually applies an oscillatory force to the oscillatory member at the resonant frequency thereof. In other words, there could be said to be self-resonant driving of the oscillatory member by the driving means. It should be noted that the mechanical noise inherent to the device and the electrical noise inherent to the driving circuit has been found to be sufficient to initiate resonance on device start-up.

Preferably, the driving means provides an oscillatory force of fixed amplitude. In other words, the driving means works in the so-called "constant drive mode" and imparts a constant oscillatory force (e.g. by application of a constant amplitude AC drive voltage to electrostatic drive electrodes) to the oscillatory member. In the absence of a magnetic field, and hence no Lorentz force, the oscillatory member will oscillate with a constant amplitude. However, the interaction of a magnetic field with the AC passing through the oscillatory member will produce an oscillatory Lorentz force which alters the amplitude of oscillation of the oscillatory member by an amount directly related to the magnetic field strength.

Alternatively, the driving, means is arranged to impart an oscillatory force to the oscillatory member of adjustable amplitude, wherein the amplitude of the oscillatory force is adjusted during use so as to maintain a given amplitude of oscillation of the oscillatory member. In other words, the driving means could be arranged so that the magnetometer works in the so-called "constant amplitude mode"; the oscillatory force imparted by the driving means being sufficient to ensure the oscillatory member resonates with a certain fixed amplitude. Application of a magnetic field will then result in the driving means altering the amplitude of the oscillatory force that it applies in order to maintain the fixed amplitude of oscillatory member resonance. In this case, the amplitude of the oscillatory force applied by the driving means provides a measure of the magnetic field strength.

Advantageously, the means for passing an AC through the oscillatory member comprises a feedback circuit arranged to receive the electrical output signal produced by the sensing means. A feedback loop (which may include appropriate amplification etc) is thus provided for generating the AC current that is passed through the oscillatory member. As the AC current is derived directly from the oscillation of the oscillatory member, it has a frequency that will always be equal to the resonant frequency thereof. There is thus no requirement to provide a separate oscillator source to generate the AC current, and the phase-locked loop arrangements used in prior art magnetometers to ensure the AC frequency tracks the resonant frequency of the oscillatory member are not required. The resulting magnetometer is thus less complex, and cheaper to fabricate, than prior art devices.

It should be noted that providing feedback loops to control both the driving means and to produce the AC passed through the oscillatory member ensures that the first and second forces are appropriately phased with respect to one another. This further increases the accuracy of magnetic field strength measurement.

Advantageously, the sensing means comprises at least one sensor electrode located on the substrate and having a variable capacitance with the oscillatory member. In other words, the sensing means measures movement of the oscillatory member via capacitative pickup.

The sensing means may advantageously comprise a plurality of elongate sensor electrodes located on the substrate and the oscillatory member may comprise a plurality of elongate electrodes interdigitated with said plurality of elongate sensor electrodes. In other words, interdigitated sets of electrodes are provided in order to produce the required capacitance variation with oscillatory member movement. To allow movement direction to be determined, the skilled person would appreciate that each elongate sensor electrode could be conveniently located closer to one of the pair of oscillatory member elongate electrodes that are adjacent thereto.

The electrodes of the oscillatory member may conveniently be maintained at a predetermined direct current (DC) polarisation voltage. In such a case, the capacitance between the electrodes of the oscillatory member and substrate can be measured directly.

Alternatively, a high frequency AC polarisation voltage (or so-called probe signal) may advantageously be applied to the electrodes of the oscillatory member. The use of a high frequency probe signal ensures the 1/f noise of the amplifying electronics do not significant affect the quality of the capacitive pick off. This frequency is also well above the mechanical response of the vibrating structure. Preferably, the high frequency probe signal is within the range of 50 KHz to many tens of MHz, more preferably it is greater than 100 KHz and even more preferably it is around 1 MHz. Implementing high frequency capacitive pick-up thus improves the signal to noise ratio of the output electrical signal produced by the sensing means.

Advantageously, the plurality of sensor electrodes may be electrically connected to form two electrode sets, the two electrode sets being arranged to provide differential capacitive pick-off. As described in more detail below, the movement induced capacitive signals provided by each electrode set can be arranged such that they are out of phase. However, the feed-through from the drive circuits in the signal produced by each electrode set will always be in-phase. Hence, subtracting the signals (i.e. determining the signal difference) will reduce noise effects and provide a cleaner movement induced signal. This differential capacitive pick-off provides an output electrical signal with significantly lower noise levels than can be obtained using direct pick-off.

Conveniently, the means for passing an AC through the oscillatory member includes means to vary the amplitude of said AC. Controlling the amplitude of the AC applied to the oscillatory member allows the sensitivity of the magnetometer to be adjusted. For a given magnetic field strength, increasing the applied AC will increase the amplitude of the Lorentz oscillatory force thereby increasing the magnetic field induced effect on the amplitude of the oscillatory member. The amplitude of the applied AC may also be reduced to zero to enable the resonant properties of the oscillatory member to be assessed without any magnetic field induced influence. This allows Q to be measured for calibration purposes.

Preferably, the driving means comprises at least one drive electrode formed on the substrate to electrostatically impart the oscillatory force to the oscillatory member. Advantageously, the driving means comprises a plurality of first elongate drive electrodes formed on the substrate and the oscillatory member comprises a plurality of second elongate drive electrodes, wherein the first elongate drive electrodes are interdigitated with the second elongate drive electrodes. In other words, an electrostatic comb drive arrangement is implemented. The provision of such a comb drive decreases the dependence of the applied electrostatic force on the displacement of the oscillatory member and thus reduces any distortion in the movement of the oscillatory member.

Although electrostatic based driving means are preferred, thermal or piezo-electric driving means may alternatively or additionally be used.

Conveniently, the oscillatory member comprises a resonant beam.

The oscillatory member may conveniently comprise at least two flexible leg portions anchored to the substrate, said AC being passed through at least one of said flexible leg portions. The flexible leg portions are preferably arranged to flex when the oscillatory member oscillates. Furthermore, the oscillatory member may conveniently comprise a substantially rigid cross-beam arranged substantially perpendicular to, and interconnecting, said at least two leg portions. The cross-beam may advantageously comprise a plurality of elongate electrodes protruding perpendicularly therefrom. These elongate electrodes may be used as part of an electro-static driving means or to provide capacitive pick off.

Preferably, the means for passing an alternating current (AC) through the oscillatory member is arranged to supply a differential AC voltage to said leg portions such that said cross-beam receives the desired polarisation voltage. In other words, a polarization voltage (V) plus ΔV is applied to one end of a leg portion whilst the polarisation voltage (V) minus ΔV is applied to the other end of the leg portion. Assuming the cross-beam is located halfway along the leg portion, it will be held at the polarisation voltage V. Furthermore, the potential difference between the ends of the leg portion will be 2ΔV. An alternating ΔV can be applied such that the required AC current flows through the leg portion(s) of the oscillatory member whilst the cross-beam is held at the desired polarisation voltage.

Advantageously, the oscillatory member is arranged to oscillate along an axis in a plane parallel to the plane of the substrate.

It should be noted that stress may arise within the suspended oscillatory member of a MEMS magnetometer of the present invention for a number of reasons. For example, an oscillatory member anchored to a substrate at two anchor points may be subjected to compressive or tensile stress via the anchor points due to thermal expansion/contraction of the substrate that is different to the expansion/contract of the oscillatory member (i.e. a thermal expansion mismatch). This is particularly the case where the substrate is mounted in a package prior to use or there are temperature gradients within the magnetometer. It is therefore preferable for the oscillatory member of the magnetometer to comprise at least one stress relief means, such as a resiliently deformable stress relief structure, to reduce stress within the suspended portion of the MEMS magnetometer device. Such a stress relief structure is preferably arranged to act as a spring to absorb any tensile/compressive forces to which the oscillatory member is subjected. In this manner, the oscillatory member is prevented from distorting or buckling during use and/or when inactive.

Furthermore, it has been found that the resonant frequency of an oscillatory member that is fixed to a substrate by a plurality of anchor points may vary non-linearly with the amplitude of oscillation. This variation in the resonant frequency with oscillation amplitude requires the frequency of AC passed along the conductive path to be continually adjusted as the magnetic field strength (and hence oscillation amplitude) vary. This can reduce device sensitivity, especially for rapidly varying magnetic fields, if optimum Q amplification is not maintained. Providing an oscillatory member having a stress relief structure(s) will reduce the non-linear effects because the spring-like nature of the stress relief structure will allow slight expansion/contraction of the oscillatory member as the amplitude of oscillation varies.

Although stress relief structures are already known for various MEMS devices, such structures typically comprise "folded back" type arrangements. The inclusion of such a folded back structure in a resonant magnetometer would result in current flow along a conductive path in a variety of directions; for example current would flow in opposite directions through the folds of a folded back structure. In the presence of a magnetic field, the Lorentz force induced by a forward flowing current region will then counteract the Lorentz force arising from a region in which the current flows in the opposite direction. The inclusion of a folded back stress relief structure would thus result in a reduced resultant oscillatory force being imparted to the oscillatory member for a given magnetic field strength, thereby decreasing the overall sensitivity of the magnetometer. It is for this reason that those skilled in the art would have typically considered a reduction in device sensitivity as an inevitable, and unacceptable, consequence of including stress relief structures in the oscillatory member of a resonant magnetometer and would thus have typically discounted the use of stress relief structures in a magnetometer device.

To ensure the stress relief structure has a minimal effect on device performance, the conductive path through a stress relief structure of a device of the present invention is preferably arranged to minimise the component of current flow in a direction opposed to the primary direction of current flow along the remainder of the conductive path. In other words, a MEMS resonant magnetometer is provided that has an oscillatory member which comprises a conductive path for carrying an electrical current and at least one resiliently deformable stress relief structure, said at least one resiliently deformable stress relief structure having a conductive portion that forms part of said conductive path, wherein said conductive portion is arranged to minimise the component of current flow in a direction opposed to the primary direction of current flow along the remainder of the conductive path.

It should be noted that the "primary direction of current flow" is simply the main direction of current flow through the oscillatory member; for example, the direction of current flow if the conductive path through the stress relief structure is ignored. In the simplest case, the conductive path of the oscillatory member leading to and from the stress relief structure(s) would be a substantially straight conductive track defining a first axis. The primary direction of current flow would then be the direction of current flow along the straight portions of the conductive path (i.e. along the first axis). In this case, the stress relief structure would preferably be arranged to minimise any current flow through the stress relief structure in the opposite direction to the current flow along the remainder of the conductive path. It should be noted that, in use, an alternating current (AC) will be passed along the conductive path to impart the required oscillatory force in the presence of a magnetic field; the primary direction of current flow will thus alternate in use.

Advantageously, said at least one stress relief structure comprises a conductive portion through which current flows in a direction less than or substantially equal to ninety degrees away from said primary direction of current flow. In other words, it is preferred that there is no substantial component of current flow in a direction opposed to the main flow direction between anchor points.

Preferably, the conductive path of the oscillatory member through which the AC is passed lies along an axis that is substantially perpendicular to axis of oscillation of the oscillatory member. In such an arrangement, an applied magnetic field will impart a force that causes movement of the oscillatory member along the axis of oscillation of the oscillatory member. The Lorentz force imparted to the oscillatory member will thus be maximised for a given magnetic field.

Advantageously, the stress relief structure comprises a folded structure, said folded structure comprising a plurality of elongate resiliently flexible arms extending in a direction substantially perpendicular to said primary direction of current flow. The provision of such a structure provides a current path through the stress relief means in which there is no current flow in a direction opposed to the primary direction of current flow. The majority of current flow in such a stress relief structure will be in a direction substantially perpendicular to the primary direction of current flow; such an arrangement ensures that the current passing through the stress relief structure has a negligible effect on the resultant oscillatory force imparted to the oscillatory member.

Conveniently, the stress relief structure comprises a resiliently deformable loop. A stress relief loop provides two current paths through the stress relief means and does not include any folds through which a reverse current will flow. In fact, there will be a significant component of current flow through the loop along the primary direction of current flow. A loop stress relief structure of this type will thus impart an oscillatory force that adds to the oscillatory force imparted due to current flow through the remainder of the conductive path.

The oscillatory member is conveniently attached to the substrate at a plurality of anchor point. Although stress relief portions may be formed in the vicinity of one or some of the anchor points, it is preferred that a stress relief structure is associated with each anchor point. This makes the arrangement more symmetrical, and reduces the possibility of twisted or asymmetric oscillatory modes being excited.

It should be noted that although the provision of a stress relief means is advantageous in a resonant magnetometer of the present invention, the stress relief means described herein could also be advantageously applied to any resonant magnetometer arrangement. A micro-electro mechanical system (MEMS) resonant magnetometer can thus be provided that comprises a oscillatory member, said oscillatory member comprising a conductive path for carrying an electrical current, wherein the oscillatory member comprises at least one resiliently deformable stress relief structure, said oscillatory member being arranged such that the oscillatory force generated by current flow through the at least one stress relief means does not substantially detract from the oscillatory force generated by current flow through the remainder of the conductive path.

Advantageously, the magnetometer is formed as a micro-electro mechanical system (MEMS). Herein the term "micro-electro mechanical system (MEMS)" is used to encompass a wide range of micromechanical sensors and actuators including those described in the art by the terms "Microsystems technology (MST)", "microrobotics" and "microengineered devices".

Conveniently, said substrate and/or said oscillatory member comprise silicon and preferably are formed from a silicon-on-insulator (SOI) wafer or a silicon-on-glass (SOG) wafer.

According to a second aspect of the invention, an inertial measurement unit (IMU) is provided that comprises at least one magnetometer according to the first aspect of the invention. Advantageously, the IMU comprises three magnetometers, each of the three magnetometers being arranged to detect magnetic fields along mutually orthogonal axes.

BREIF DESCRIPTION OF THE DRAWINGS

Figure 2:
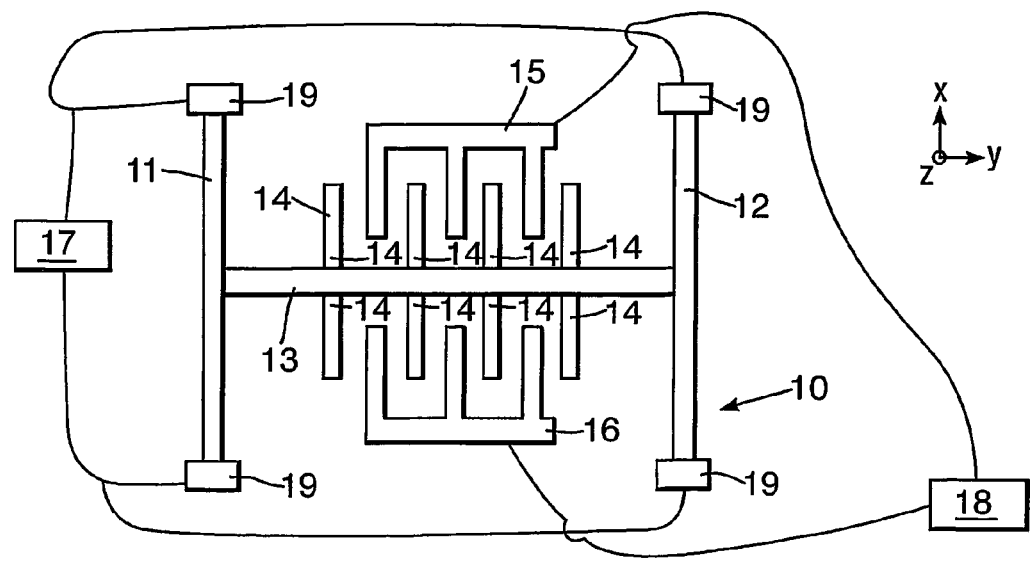
Figure 4A:
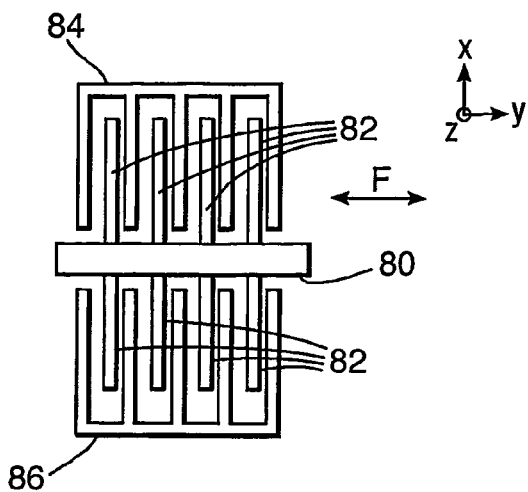
Figure 4B:
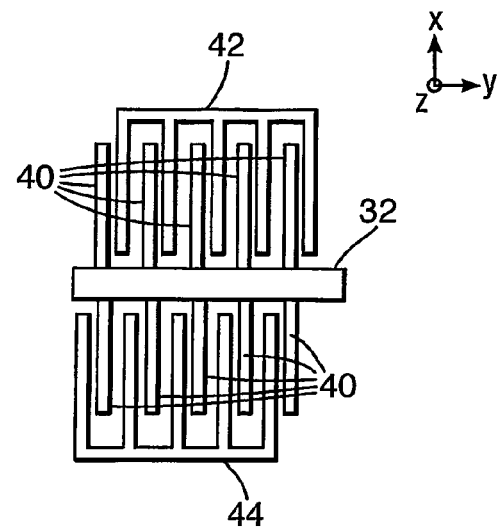
Figure 4C:
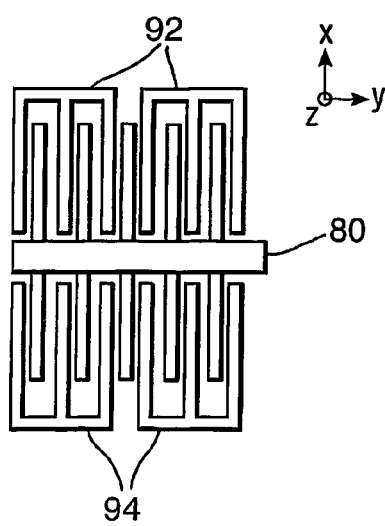
Figure 5A:
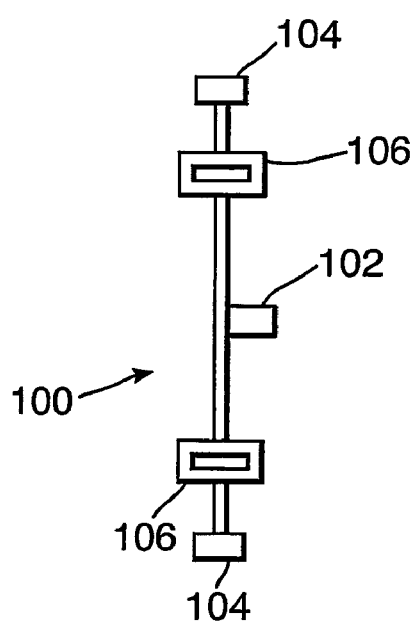
Figure 5B:
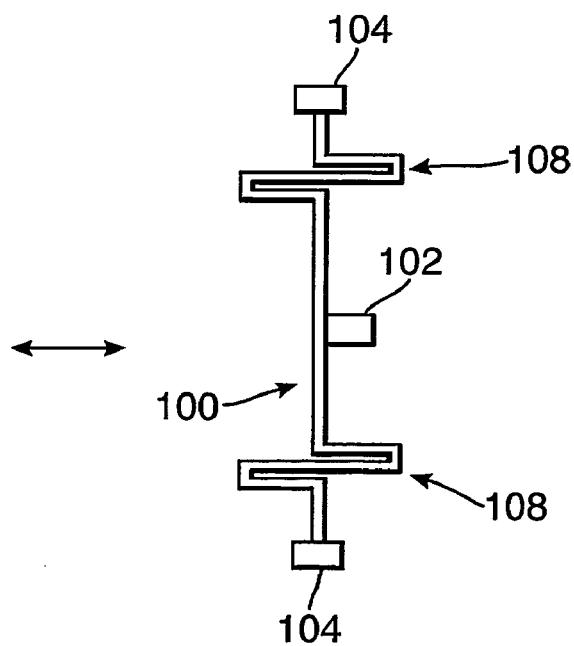
Figure 5C:
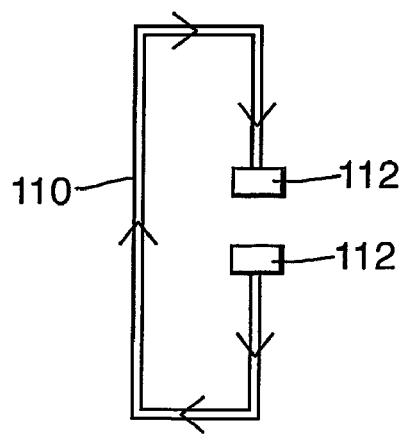
Figure 6A:
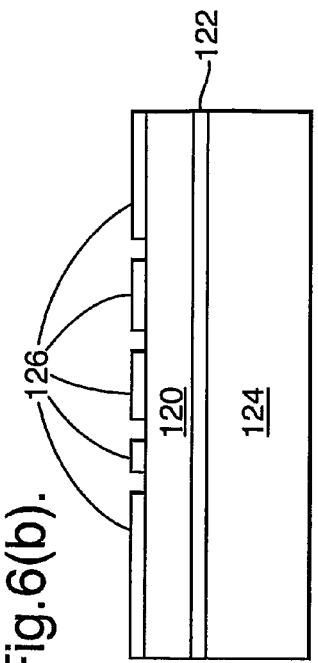
Figure 6B:
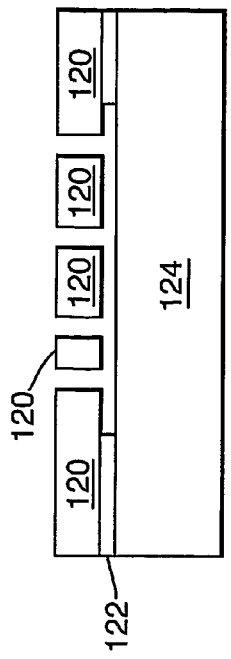
Figure 6C:
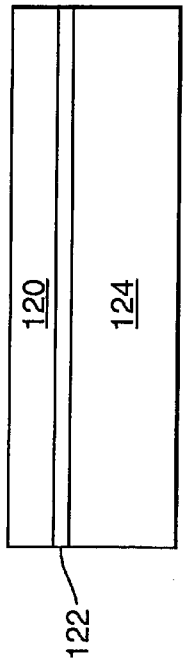
Figure 6D:
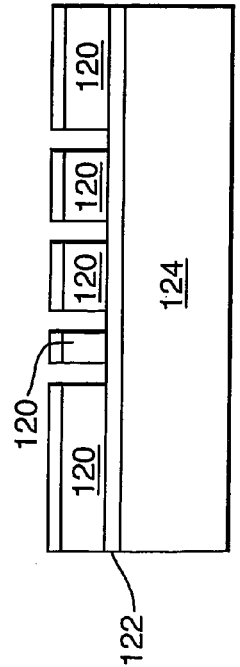
Figure 6E:
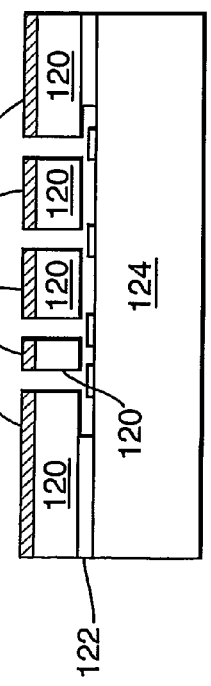
Figure 7:
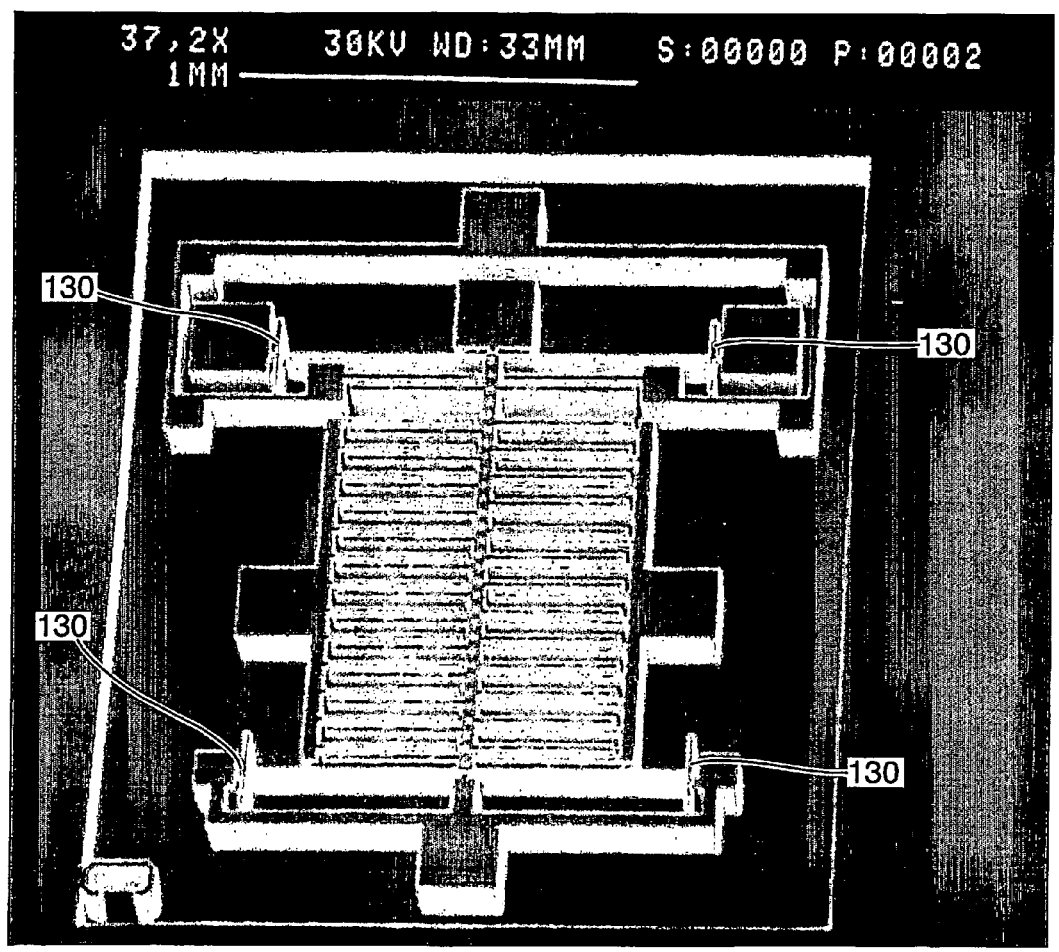

The invention will now be described, by way of example only, with reference to the following drawings in which;

FIG. 1 shows the basic principle of operation of a prior art MEMS magnetometer,

FIG. 2 illustrates the operation of a prior art MEMS magnetometer having in-plane oscillation, FIG. 3 shows a MEMS magnetometer of the present invention, FIG. 4 shows a number of electrode arrangements that can be employed in a MEMS magnetometer of the type shown in FIG. 3, FIGS. 5a and 5b illustrate the use of folded beams to improve magnetometer performance and FIG. 5c shows a prior art back folded beam, FIG. 6 illustrates a process that can be used to fabricate a MEMS magnetometer, and FIG. 7 is a photomicrograph of a magnetometer of the present invention.

DETAILED DISCUSSION OF EMBODIMENTS

Referring to FIG. 1, a simple bar magnetometer 2 of the type described by Wickenden et al is shown. The magnetometer comprises a resonant bar 4 supported by a first electrode 6 and a second electrode 8. The first and second electrodes 6 and 8 are located at the nodal points of the fundamental mode of vibration of the bar 4.

An electrical current (I) passing through the bar 4 will, on interaction with a magnetic field (B), produce an out-of-plane Lorentz force (F). In use, an alternating current (AC) is applied to the bar 4 via the first electrode 6 and the second electrode 8. The frequency of the applied AC is matched to the resonant frequency of the resonant bar 4 thereby causing the device to resonate in the presence of a in-plane magnetic field (B). For a given applied current, the magnitude of resonance is indicative of the magnitude of the applied magnetic field. This Lorentz force effect forms the basis of operation of all resonant magnetometers.

Referring to FIG. 2, a prior art resonant magnetometer of the type described by Izham et al is shown. The device comprises a suspended resonant beam structure 10 having a first leg 11, a second leg 12 and a cross-beam 13. Each end of each leg is fixed to the substrate at an anchor point 19. The cross-beam 13 comprises a plurality of finger electrodes 14 that protrude orthogonally from each side of the cross-beam portion 13 and lie in a plane parallel to the plane of the substrate. A first set 15 and a second set 16 of capacitative pick-up finger electrodes are formed in the substrate on either side of the suspended cross-beam portion 13. The device is arranged such that finger electrodes 14 of the suspended cross-beam portion 13 are inter-digitated with the first and second sets 15 and 16 of finger electrodes formed on the substrate.

The suspended resonant beam structure 10 is free to move in one axis in the plane of the substrate (i.e. along the y-axis of FIG. 2). In use, a driving circuit 17 generates an AC current at the resonant frequency of the suspended resonant beam structure 10 and passes the current along the first leg 11. Any magnetic field applied in a direction perpendicular to the (x-y) plane of the substrate produces a Lorentz force that causes the resonant beam structure 10 to resonate (i.e. to oscillate back and forth along the y-axis). Displacement of the resonant beam structure 10 alters the capacitance associated with the first and second set of finger electrodes 15 and 16 and the finger electrodes 14 of the cross-beam portion; this capacitance variation is measured by a capacitive pick-up circuit 18 allowing the applied magnetic field strength to be determined.

As described above, the prior art arrangement shown in FIG. 2 has a number of disadvantages. For example, the driving circuit 17 needs to comprise a frequency generator that can produce an AC current with a frequency accurate to 1Hz in several KHzs. A frequency tracking circuit (not shown) is also necessary in order to ensure that the drive frequency applied by circuit 17 is constantly matched to the resonant frequency as measured by the pick-up circuit 18; such a circuit will contribute electrical noise to the system and will only provide a measure of the resonant frequency when a magnetic field has driven the beam structure into resonance. Furthermore, the pick-up electrodes 15 and 16 produce an electrical output at the oscillation frequency of the resonant mass and thus pick up noise due to the driving circuit thereby reducing the measurement accuracy of the magnetometer. In addition, the fixed-fixed arrangement of the first and second legs 11 and 12 allows the build up of mechanical stress that will at best alter the resonant frequency of the device and at worst cause the entire structure to buckle.

Figure 3A:
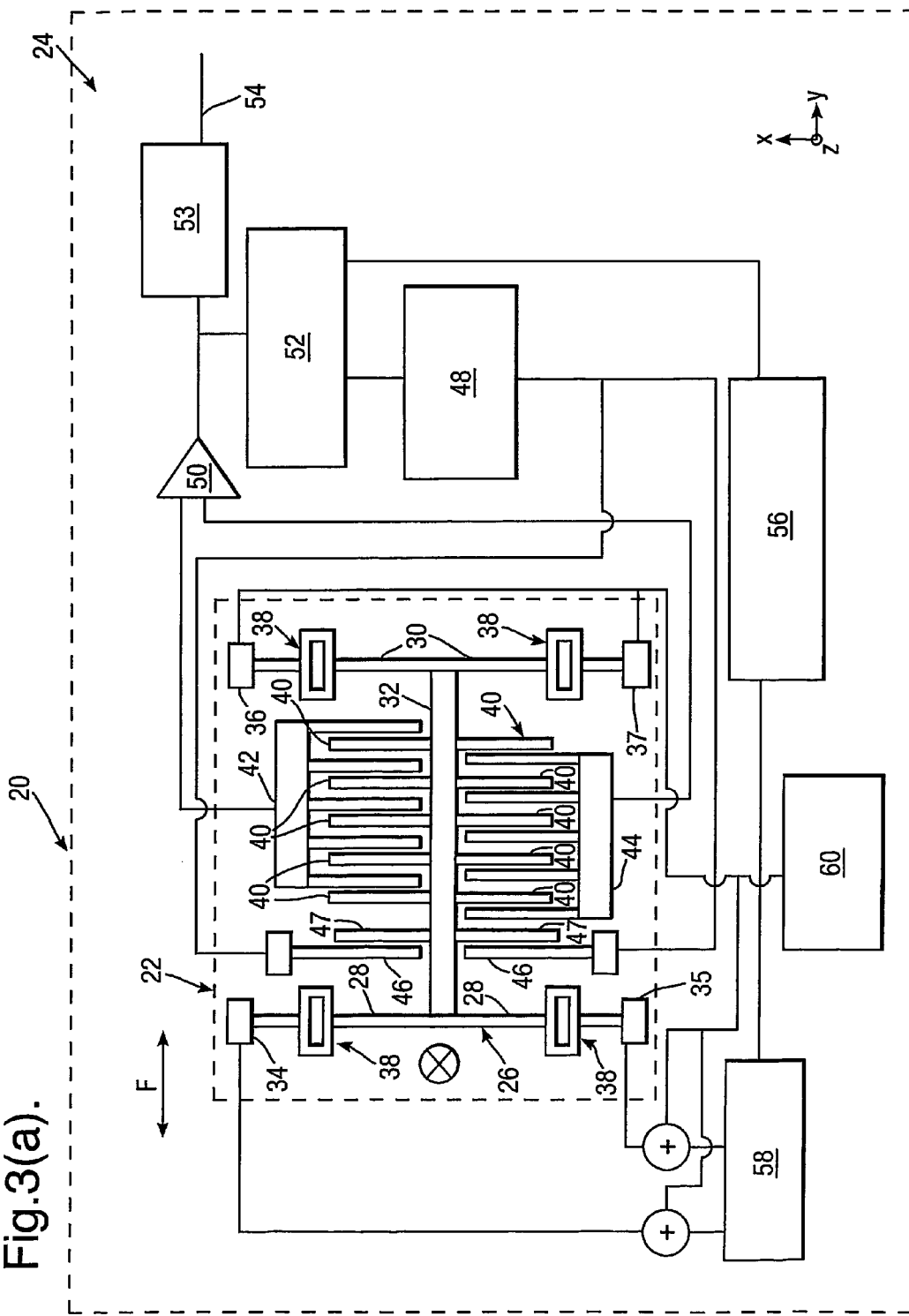

Referring to FIG. 3a, a self-resonant magnetometer 20 of the present invention is shown. The magnetometer 20 comprises an active region 22 formed from an SOI substrate and associated control circuitry 24.

The active region 22 comprises a suspended resonant beam structure 26 (i.e. a suspended mass) having a first leg 28, a second leg 30 and a cross-beam 32. The cross-beam 32 is formed as box section to provide a high degree of stiffness without adding significant amounts of mass. The provision of such a box-section cross-beam prevents the excitation of twisted oscillation modes.

The ends of the first leg 28 are physically attached to the substrate at first and second anchor points 34 and 35 respectively. Similarly, the ends of the second leg 30 are physically attached to the substrate at third and fourth anchor points 36 and 37 respectively. Stress relief loops 38 are provided at each end of the first and second legs to reduce physical stress; the design and operation of the stress relief loops is described in more detail with reference to FIG. 4 below.

The cross-beam portion 32 of the suspended resonant beam structure 26 carries a plurality of finger electrodes 40 that protrude orthogonally from each side of the cross-beam portion 32 and lie in the plane of the substrate. A first set 42 and a second set 44 of capacitive pick-up finger electrodes are formed in the substrate on either side of the suspended cross-beam portion 32. The device is arranged such that finger electrodes 40 of the suspended cross-beam portion 32 are inter-digitated with the first and second sets 42 and 44 of finger electrodes. As described below, the electrode arrangement allows any movement of the suspended resonant beam structure 26 to be sensed capacitively. A pair of driving electrodes 46 are also formed in the substrate, and located in the vicinity of an end pair of finger electrodes 47 carried by the cross-beam portion 32.

In use, the device is operated in so-called "self resonant mode". The suspended resonant beam structure 26 is electrostatically driven to resonate by an electrostatic drive circuit 48 that applies a drive voltage to the pair of driving electrodes 46. Movement of the resonant beam structure is sensed by differential capacitive pick-up using the first and second sets 42 and 44 of finger electrodes. The capacitive pick-off is fed to a differential amplifier 50 and directed, via a 90° phase shifter circuit 52 (or a differentiator circuit), to the electrostatic drive circuit 48. In this manner, a positive electronic feed-back loop arrangement is implemented with the signal generated by capacitive pick-off being used to electrostatically drive the resonant beam structure 26.

The output signal produced by the differential amplifier 50 is also fed, via a clipper current drive circuit 56, to a differential drive circuit 58. A polarisation voltage source 60 is also provided. The differential drive circuit is arranged to apply the polarisation voltage (V) plus ΔV to the first leg 28 via the first anchor points 34, and also the polarisation voltage (V) minus ΔV to the other end of the first leg 28 via the second anchor point 35. The polarisation voltage (V) is applied to both ends of the second leg 30 at third and fourth anchor points 37 and 38.

This differential drive arrangement, which is a voltage source circuit, enables an AC current to flow through the first leg of the suspension whilst keeping the cross-beam 32 at a desired polarisation voltage (i.e. at the voltage supplied by the polarisation voltage source 60). Ensuring the crossbeam is kept at a fixed voltage allows low noise capacitative pick-off to be provided. The level of ΔV can be fixed, potentially introducing uncertainty in the current flow due to variations in the resistance the suspension, or the current can be monitored and ΔV varied to keep the amplitude of the current constant.

It should be re-emphasised that, unlike prior art magnetometer devices, the AC current used in the magnetometer 20 is not generated using a separate frequency generator source but is derived directly from the oscillation of the suspended resonant beam structure 26. This feedback arrangement reduces noise levels and ensures the Q amplification is always maximised.

The amplitude of the resonant beam structure oscillation is obviously dependent on the sum of the electrostatic drive and Lorenz forces. In the arrangement shown in FIG. 3, the amplitude of the electrostatic drive is kept constant; i.e. the magnetometer is operated in constant drive mode. The output of the differential amplifier 50, after passing through a rectifier/filter circuit 53, provides an output on signal line 54 that is related to the amplitude of motion and is thus indicative of the strength of the applied magnetic field.

In constant drive mode, the electrostatic drive level should be selected to be high enough such that the device keeps resonating when the largest magnetic field to be measured is applied. In other words, the resultant force induced by the applied magnetic field and the electro-static driving mechanism should always be sufficiently high to maintain resonance without causing the suspended resonant beam to hit its end stops. It should be noted that even if the applied magnetic field halts resonance or causes the beam to hit its end stops, the device will not normally be damaged and will operate normally again (without requiring re-calibration) when the magnetic field strength or AC current is reduced.

Instead of operating in a constant drive mode, the magnetometer may comprise a control loop to vary the amplitude of the electrostatic drive signal in order to keep the amplitude of oscillation constant; i.e. it operates in constant amplitude mode.

The amplitude of the applied drive voltage then provides an indication of the magnetic field strength applied to the device.

The capacitive pick off arrangement described above is a so-called displacement current detector. In such an arrangement, the polarisation voltage is fixed at a suitable DC level and the amplifying electronics (e.g. the differential amplifier 50 etc) work at the resonant frequency of the device. For CMOS pick off amplifiers, which would typically be used, in an integrated unit or an application specific integrated circuit (ASIC), this operating frequency is within the 1/f noise of the amplifier and the signal to noise ratio of the device will thus be reduced.

To reduce these 1/f noise effects, the capacitance can be sensed using a high frequency (e.g. 1 MHz) probe signal. In this context, "high frequency" means a frequency that is well above the 1/f noise region of the amplifier and also well above the mechanical response of the vibrating structure. The polarisation voltage produced by the polarisation voltage source 60 will be the high frequency probe signal and the output of the capacitive pick-off, after suitable gain, will need demodulating and filtering. The feedback loops for such a system are completed as for the base-band implementation described above, but with a 180° phase shifting means (not shown) replacing the 90° phase shifting circuit 52.

In order to obtain the required Q to operate the magnetometer as a compass, it can be packaged in a reduced pressure environment. The Q is highly dependent on pressure which in turn affects the sensitivity and bandwidth. Another advantage of this device is that it can also be used to directly measure the Q for calibration purposes. If the AC current passed through the beam structure 26 is turned off, then only the electrostatic force imparted by the electrostatic drive circuit 48 via the driving electrodes 46 will act to drive the suspended resonant beam structure 26 into resonance. In such a case, the amplitude of oscillatory motion (or the drive force applied if operating in constant amplitude mode) will be related to the Q.

It may also be advantageous to use two equivalent devices simultaneously, one to measure the Q and one as a magnetic sensor such that both measurements are available simultaneously. Calibration may also be obtained by the inclusion of a planar coil formed on the wafer around the device. Known currents fed through the planar coil will generate known magnetic fields at the device.

Figure 3B:
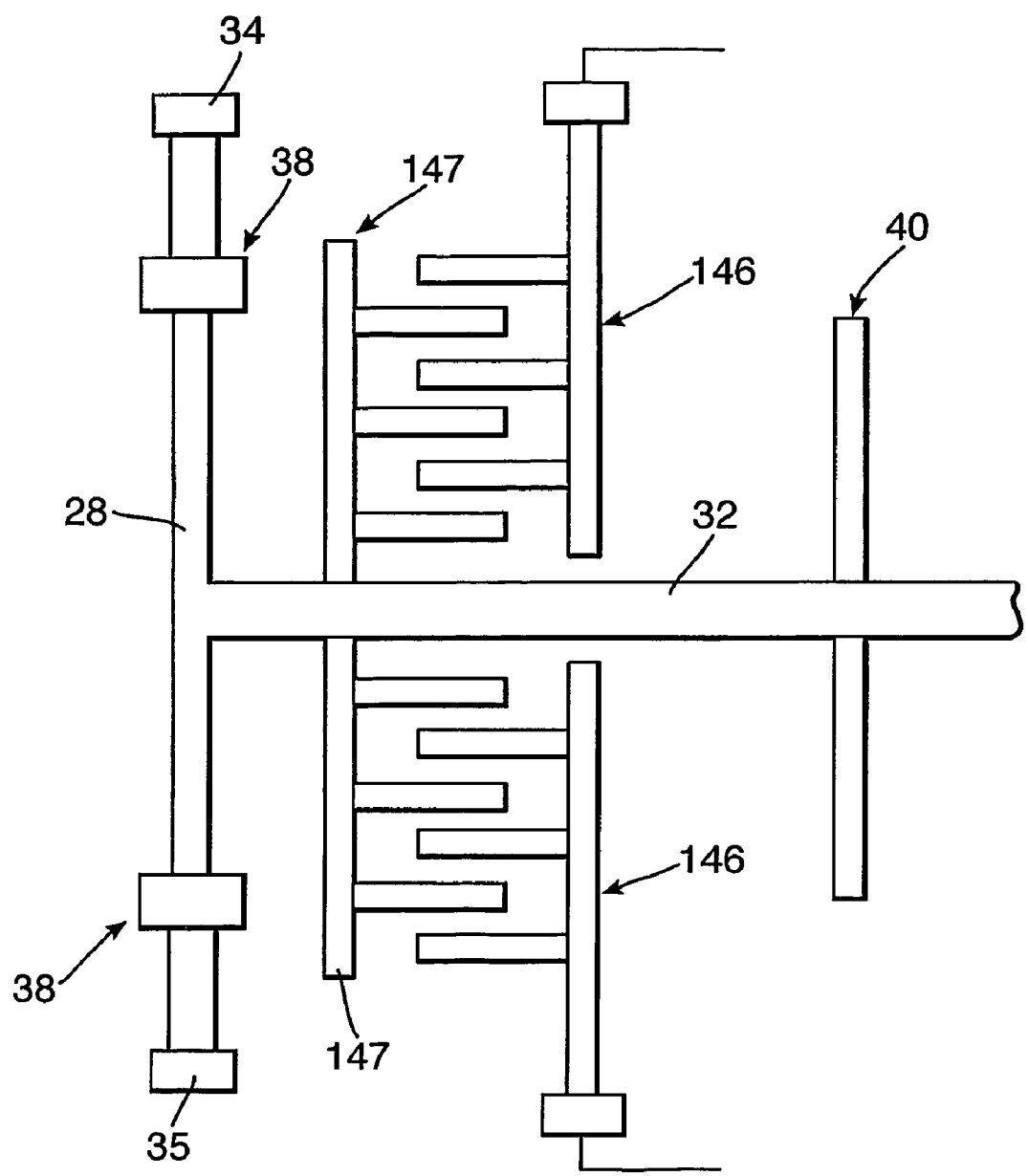

As described above, the suspended resonant beam structure 26 of the device illustrated in FIG. 3a is driven electrostatically using a pair of driving electrodes 46 formed in the substrate and a corresponding pair of finger electrodes 47 carried by the cross beam portion 32. FIG. 3b shows an alternative embodiment in which an electrostatic comb drive arrangement is employed. In the arrangement of FIG. 3b, the cross-beam 32 carries an electrode arrangement 147 that comprises a plurality of finger electrodes. Corresponding driving electrodes 146 are formed on the substrate. The elongate driving electrodes 146 of the substrate interdigitate with the finger electrodes of the electrode arrangement 147 and thus provide an electrostatic comb drive. The comb drive arrangement minimises the displacement dependence of the applied electrostatic force and also reduces any distortion in the movement of the suspended beam structure 26. The skilled person would also recognise the various alternative driving arrangements that could be used in a device of the present invention.

Referring to FIG. 4, a number of alternative capacitative pick-up arrangements that are suitable for inclusion in a magnetometer of the present invention are shown. FIG. 4b shows the arrangement employed in the device of FIG. 3a, whilst FIGS. 4a and 4c illustrate alternative arrangements.

FIG. 4a illustrates a so-called single ended pick-up arrangement of the type described by Izham et al. A suspended cross beam 80 comprises a number of finger electrodes 82 that interdigitate with two sets of substrate finger electrodes 84 and 86. Movement of the cross beam 80 in the y-direction alters the capacitance of the arrangement and provides an indication of cross beam displacement. A disadvantage of this arrangement is that it is difficult to separate the electrical signal due to beam movement from the driving circuit feed-through and electrical influence of the surrounding electrical circuits The differential pick-up arrangement illustrated in FIG. 4b (which is similar to that described with reference to FIG. 3 above) allows measurements to be made with a lower level of associated noise. The cross-beam 32 is located between two sets of finger electrodes 42 and 44 that are laterally off-set relative to one another. Movement of the cross-beam 32 results in the production of a movement induced signal from one set of finger electrodes, say electrodes 42, that is out of phase with the movement induced signal provided by the other set of electrodes 44. In contrast, the noise associated with the signals produced by each of the electrode 42 and 44 is obviously in phase. Consequently, subtracting the signals produced by the electrodes 42 and 44 removes the majority of the unwanted background noise but adds the signals induced by cross-beam movement. It is for this reason that differential pick-up arrangements are preferred.

FIG. 4c shows an alternative differential pick-up arrangement in which each of the two sets of finger electrodes 92 and 94 formed in the substrate are split in two. This provides an electrode arrangement that is symmetrical on both sides thereby balancing the electrostatic forces generated by the pick-up circuit to avoid imparting twisting motion.

As described with reference to FIG. 3, a magnetometer of the present invention comprises a suspension (i.e. the suspended resonant beam structure 26) that incorporates stress relief loops. Referring now to FIG. 5, two mechanical stress relief arrangements suitable for use in a resonant magnetometer are shown.

FIG. 5a shows a resonant beam 100 supporting a central mass 102 and anchored to the substrate at anchor points 104. Stress relief loops 106 are located at each end of the suspension. The stress relief loops shown in FIG. 5a have the dual benefits of providing stress relief without affecting the force induced by the applied magnetic field and also allowing the suspension to operate in a much more linear fashion.

Instead of the loop, a fold 108 can be formed at each end of the resonant beam 100 as shown in FIG. 4b. The folds 108 are arranged such that the distance that the current flows in each direction is equal. This ensures that the Lorentz forces arising due to the interaction of the current flowing along the fold 108 and an applied magnetic field will balance out.

Various stress relief structures have been used previously in other MEMS devices such as accelerometers. For example, FIG. 5c shows a prior art folded back beam 110 for an accelerometer that is attached to a substrate at two anchor points 112. The skilled person would not have used such a folded suspension in a magnetometer because Lorenz forces would cancel due to current flowing in opposite directions (i.e. up and down the folds).

The formation of stress relief means of the type shown in FIGS. 5a and 5b has thus solved a number of problems associated with magnetometer devices in general and the device of Izham et al. in particular. Firstly, stress in the substrate can cause the beams to buckle and the device to fail. The stress can be caused by a thermal mismatch between the packaging and the device, and also any residual stress from the manufacturing of the SOI. The stress relief means prevent this buckling from occurring. Secondly, the stiffness of fixed-fixed beams is not linear with amplitude, therefore causing the resonant frequency to change with the amplitude of oscillation. Providing stress relief loops or folds reduces this non-linearity.

Referring to FIG. 6, the manufacture of a device in accordance with the present invention is illustrated.

FIG. 6a shows an SOI substrate comprising a mechanical silicon layer 120, a sacrificial oxide layer 122 and a handle wafer 124. As shown in FIG. 6b, a oxide layer 124 is deposited on the silicon layer 120 and etched to defined a mask. Referring to FIG. 6c, it is shown how the mechanical silicon layer 120 is etched through the mask oxide layer 126 down to the sacrificial oxide layer 122. The suspended structure formed in the mechanical silicon layer 120 is then released by removing a portion of the sacrificial oxide as shown in FIG. 6d, before being blanket coated with a metal layer 128 to form the low ohmic conductors seen in FIG. 6e.

FIG. 7 shows a photomicrograph of a magnetometer of the present invention formed on an SOI wafer. The stress relief structures of the magnetometer are indicated by the reference numeral 130.

Although the metalised SOI process outlined above may conveniently be employed, the device could just as well be fabricated from electroformed metal using a LIGA like process. In fact the skilled person would recognise the numerous techniques that could be employed to fabricate magnetometer of the present invention.

Finally, it should be noted that the magnetometer may be fabricated in parallel with other inertial sensors for use in Inertial Measurement Units (IMU). A single chip can therefore contain an accelerometer, magnetometer and a gyroscope or any combination of the three. Three such chips can be used in a compact silicon 6 degree of freedom IMU.

The invention claimed is:

1. A resonant magnetometer comprising:
an oscillatory member; and
means for passing an alternating current (AC) through said oscillatory member for imparting an oscillatory force on said member, wherein a driver is additionally provided to impart a magnetic field independent oscillatory force to said oscillatory member, said driver including an amplifier having an input based upon an output from a sensor, said sensor providing an electrical output signal dependent on the deflection of the oscillatory member, and wherein the alternating current is derived directly from the oscillation of the oscillatory member without using a separate frequency generator source thereby implementing a positive feedback self resonant drive signal to the oscillatory member.

2. An inertial measurement unit (IMU) comprising at least one magnetometer according to claim 1.

3. An IMU according to claim 2 wherein three magnetometers are provided, each of the three magnetometers being arranged to detect magnetic fields along mutually orthogonal axes.

4. A magnetometer according to claim 1 wherein the driver provides an oscillatory force of fixed amplitude.

5. A magnetometer according to claim 1 in which the driver is arranged to impart an oscillatory force to the oscillatory member of adjustable amplitude, wherein the amplitude of the oscillatory force applied by the driver is adjusted during use so as to maintain a given amplitude of oscillation of the oscillatory member.

6. A magnetometer according to claim 1 wherein the means for passing an AC through the oscillatory member comprises a feedback circuit arranged to receive the electrical output signal produced by the sensor.

7. A magnetometer according to claim 1 wherein the sensor comprises at least one sensor electrode located on the substrate and having a variable capacitance with the oscillatory member.

8. A magnetometer according to claim 7 wherein the sensor comprises a plurality of elongate sensor electrodes located on the substrate and the oscillatory member comprises a plurality of elongate electrodes interdigitated with said plurality of elongate sensor electrodes.

9. A magnetometer according to claim 8 wherein the electrodes of the oscillatory member are maintained at a predetermined direct current (DC) polarisation voltage.

10. A magnetometer according to claim 8 wherein a high frequency AC polarisation voltage is applied to the electrodes of the oscillatory member.

11. A magnetometer according to claim 8 wherein said plurality of sensor electrodes are electrically connected to form two electrode sets, the two electrode sets being arranged to provide differential capacitive pick-off.

12. A magnetometer according to claim 1 wherein the means for passing an AC through the oscillatory member includes means to vary the amplitude of said AC.

13. A magnetometer according to claim 1 wherein the driver comprises at least one drive electrode formed on the substrate to electrostatically impart the oscillatory force to the oscillatory member.

14. A magnetometer according to claim 1 in which the driver comprises a plurality of first elongate drive electrodes formed on the substrate and the oscillatory member comprises a plurality of second elongate drive electrodes, wherein the first elongate drive electrodes are interdigitated with the second elongate drive electrodes.

15. A magnetometer according to claim 1 wherein the oscillatory member comprises a resonant beam.

16. A magnetometer according to claim 1 wherein the oscillatory member comprises at least two flexible leg portions, said AC being passed through at least one of said at least two flexible leg portions.

17. A magnetometer according to claim 16 wherein the oscillatory member comprises a substantially rigid crossbeam arranged substantially perpendicular to, and interconnecting, said at least two leg portions.

18. A magnetometer according to claim 17 wherein the cross-beam comprises a plurality of elongate electrodes protruding perpendicularly therefrom.

19. A magnetometer according to claim 17 wherein the means for passing an alternating current (AC) through the oscillatory member is arranged to supply a differential AC voltage to said leg portions such that said cross-beam receives the desired polarisation voltage.

20. A magnetometer according to claim 1 wherein the oscillatory member is arranged to oscillate along an axis in a plane parallel to the plane of the substrate.

21. A magnetometer according to claim 1 wherein the oscillatory member comprises at least one stress reliever.

22. A magnetometer according to claim 21 wherein the at least one stress reliever comprises a stress relief loop.

23. A magnetometer according to claim 1 wherein said magnetometer is formed as a micro-electro mechanical system (MEMS).

24. A magnetometer according to claim 1 wherein said substrate and oscillatory member comprise silicon.

25. A magnetometer according to claim 24 wherein said substrate and oscillatory member are formed from any one of a silicon-on-insulator (SOI) wafer and a silicon-on-glass (SOG) wafer.

26. A resonant magnetometer comprising an oscillatory member and means for passing an alternating current (AC) through said oscillatory member, wherein a driver is additionally provided to impart a magnetic field independent oscillatory force to said oscillatory member, the magnetometer further comprising a sensor for providing an electrical output signal dependent on the deflection of the oscillatory member, the sensor comprising a plurality of substrate electrodes comprised of elongate sensor electrodes located on a substrate interdigitated with a plurality of oscillatory member electrodes comprised of elongate sensor electrodes on said oscillatory member, said substrate electrodes and said oscillatory member electrodes comprising a variable capacitor.

27. A magnetometer according to claim 26 wherein the electrodes of the oscillatory member are maintained at a predetermined direct current (DC) polarisation voltage.

28. A magnetometer according to claim 26 wherein a high frequency AC polarisation voltage is applied to the electrodes of the oscillatory member.

29. A magnetometer according to claim 26 wherein said plurality of sensor electrodes are electrically connected to form two electrode sets, the two electrode sets being arranged to provide differential capacitive pick-off.

* * * * *